(12) United States Patent
Pilo (10) Patent No.: US 12,073,876 B2
(45) Date of Patent: Aug. 27, 2024

(54) MEMORY CLOCK LEVEL-SHIFTING BUFFER WITH EXTENDED RANGE

(71) Applicant: Synopsys, Inc., Mountain View, CA (US)

(72) Inventor: Harold Pilo, Underhill, VT (US)

(73) Assignee: Synopsys, Inc., Sunnyvale, CA (US)

( * ) Notice: Subject to any disclaimer, the term of this patent is extended or adjusted under 35 U.S.C. 154(b) by 189 days.

(21) Appl. No.: 17/891,395

(22) Filed: Aug. 19, 2022

(65) Prior Publication Data

US 2024/0062810 A1 Feb. 22, 2024

(51) Int. Cl.
*G11C 8/00* (2006.01)
*G11C 11/418* (2006.01)

(52) U.S. Cl.
CPC ................... *G11C 11/418* (2013.01)

(58) Field of Classification Search
CPC ..... G11C 11/418; G11C 5/147; G11C 11/417; G11C 7/1057; G11C 7/1084; G11C 7/225
USPC ........................................................ 365/233
See application file for complete search history.

(56) References Cited

U.S. PATENT DOCUMENTS

| | | | | |
|---|---|---|---|---|
| 6,185,119 | B1* | 2/2001 | Haeberli | G11C 11/5621 365/207 |
| 8,730,703 | B2* | 5/2014 | Fukuoka | H03K 19/0016 713/300 |
| 8,923,085 | B2* | 12/2014 | Chung | G11C 29/022 365/158 |
| 9,214,925 | B2* | 12/2015 | Lee | H03K 3/356121 |
| 2010/0165754 | A1* | 7/2010 | Gupta | G11C 11/413 365/189.11 |

* cited by examiner

*Primary Examiner* — Tha-O H Bui
(74) *Attorney, Agent, or Firm* — Lowenstein Sandler LLP (57) ABSTRACT

A level shifter circuit includes a level shifter configured to receive a first clock signal associated with a first power level and generate a second clock signal associated with a second power level, wherein the second power level is greater than the first power level. The level shifter circuit further includes an input clock buffer having a first input, wherein the first input comprises the second clock signal from the level shifter, and a second input coupled in parallel to the first input, wherein the second input includes the first clock signal.

20 Claims, 7 Drawing Sheets

MEMORY CLOCK LEVEL-SHIFTING BUFFER WITH EXTENDED RANGE

TECHNICAL FIELD

The present disclosure relates to the field of integrated circuits (IC), and in particular to memory clock level-shifting buffers for ICs.

BACKGROUND

Integrated circuits (ICs) frequently include circuits that operate at different power levels. For example, input/output (I/O) circuits frequently operate at a higher voltage than circuits in the core of the IC. A level shifter circuit may be used when an IC includes signals generated by a circuit at a first power level that are then provided to another circuit operating at a higher or a lower power level. For example, the level shifter can receive an input signal having a lower power level and provide an output signal having a higher power level, or vice versa.

SUMMARY

In one embodiment, a level shifter circuit includes a level shifter configured to receive a first clock signal associated with a first power level (VDDP) and generate a second clock signal associated a second power level (VDDA), wherein the second power level may be greater than the first power level. The level shifter circuit can further include an input clock buffer including a first input, wherein the first input includes the second clock signal from the level shifter, and a second input coupled in parallel to the first input, wherein the second input includes the first clock signal.

In some embodiments, the first power level includes a peripheral voltage and the second power level includes a bitcell array voltage. In some embodiments, the input clock buffer may be configured to generate an output clock signal when the difference between the second power level and the first power level is above a predetermined threshold voltage, and generate the output clock signal when the difference between the second power level and the first power level is below the predetermined threshold voltage. The output clock signal may be provided as inputs to a memory periphery and a memory timer, wherein the memory periphery and memory timer are coupled in parallel to the input clock buffer. In some embodiments, the input clock buffer includes a third input, wherein the third input may be received from the memory timer in parallel to the first input and the second input. In some embodiments, the output clock signal includes an internal memory clock signal. The predetermined threshold voltage may be about 400 mV. The level shifter circuit includes a single rail design or a dual rail design. The level shifter circuit may also include a plurality of inverters configured to introduce a delay in the level shifter circuit. In some embodiments, an input terminal of the level shifter may be coupled to an input/output circuit.

In some embodiments, a method for level-shifting in an integrated circuit includes providing a level shifter to receive a first clock signal associated with a first power level and generate a second clock signal associated with a second power level, wherein the second power level is greater than the first power level. The method further includes providing an input clock buffer with a first input, wherein the first input includes the second clock signal from the level shifter. The method further includes providing the input clock buffer with a second input in parallel to the first input, wherein the second input includes the first clock signal. The first power level may include a peripheral voltage and the second power level may include a bitcell array voltage. The method may further include generating an output clock signal, by the input clock buffer, when a difference between the second power level and the first power level is above a predetermined threshold voltage, and generating the output clock signal when the difference between the second power level and the first power level is below the predetermined threshold voltage.

The method may also include providing the output clock signal as inputs to a memory periphery and a memory timer, wherein the memory periphery and memory timer are coupled in parallel to the input clock buffer. The method may further include providing the input clock buffer with a third input, wherein the third input is received from the memory timer in parallel to the first input and the second input. The output clock signal may include an internal memory clock signal. The method may further include coupling an input terminal of the level shifter to an input/output circuit.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to memory clock level-shifting buffers with an extended range.

Figure 1:
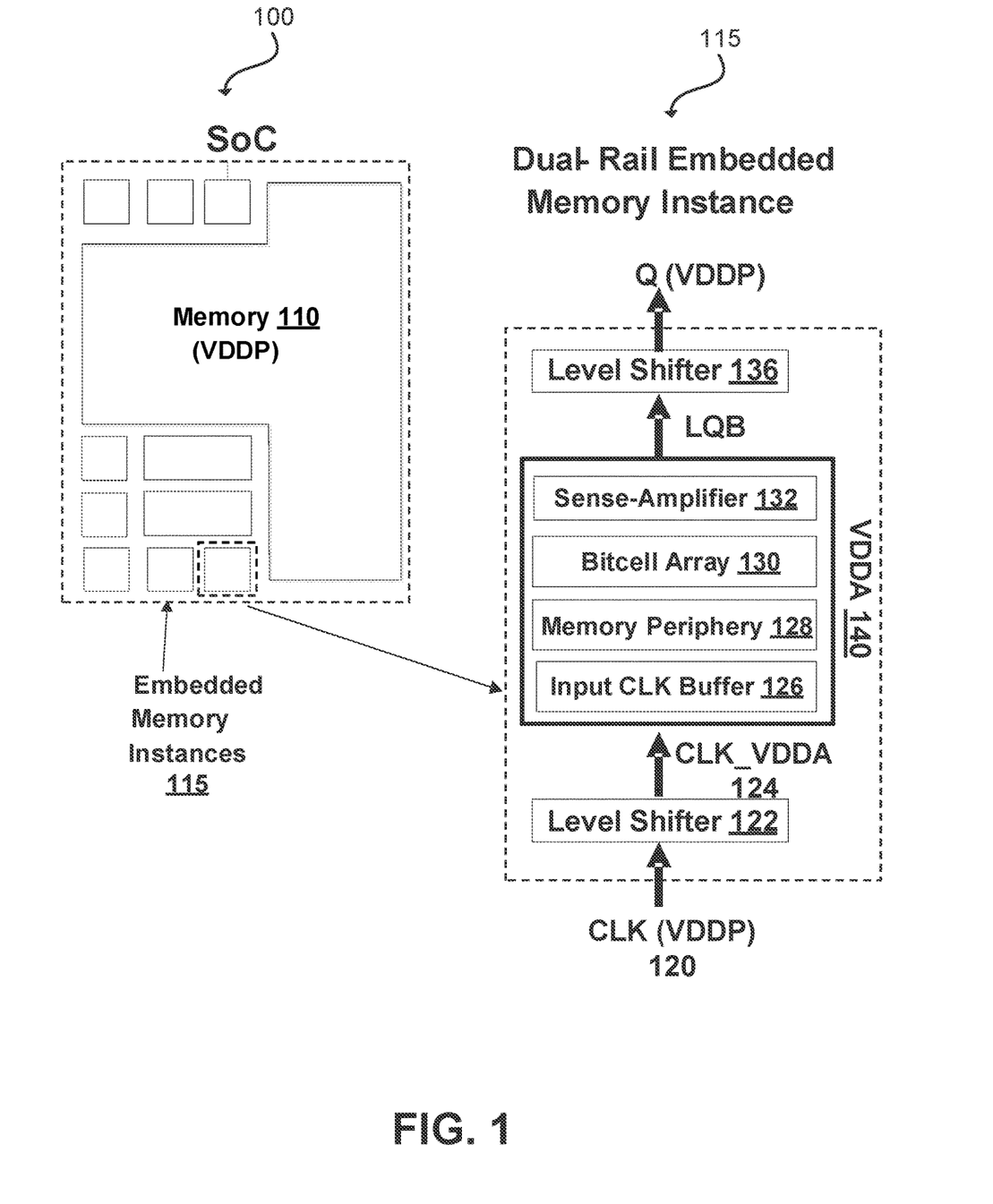
FIG. 1 illustrates a block diagram of a system-on-chip (SoC) and a dual-rail embedded memory instance within the SoC, according to aspects of the disclosure.

FIG. 1 illustrates a block diagram of an integrated circuit (e.g., a system-on-chip (SoC) 100. In one embodiment, SoC 100 represents a volatile memory device (e.g., a static random access memory (SRAM)) and may include one or more central processing units (CPUs), memory interfaces, on-chip input/output devices, input/output interfaces, secondary storage interfaces, radio modems and/or one or more graphics processing units (GPUs). SoC 100 may contain digital, analog, mixed-signal, and/or radio frequency signal processing functions. SoC 100 may include a storage area or memory 110, which may store the SoC logic or computer-executable programs including computer-executable instructions, and one or more embedded memory instances 115.

In some embodiments, SoC 100 can be coupled with physically separate memory and secondary storage devices (e.g., a low-power double data rate (LPDDR), an embedded universal flash storage (eUFS), or an embedded multimedia card (eMMC)) that may be layered on top of the SoC in what is known as a "package on package (PoP)" configuration, or be placed close to the SoC 100.

SoC 100 power supply scaling is, however, limited by the SRAM's bitcell operation. FIG. 1 further illustrates a block diagram of one of the embedded memory instances 115 (e.g., a dual rail embedded memory instance). The dual rail embedded memory instance 115 may include level shifters 122, 136 that may modify the incoming voltage to a higher or lower level based on the need of the SoC 100. The memory instance 115 may include an input clock buffer 126, a memory periphery 128, a bitcell array 130, and a sense-amplifier 132, which are described in further detail with respect to FIG. 2. In an SRAM's dual rail embedded memory instance 115, a dual voltage rail architecture provides the separation of the SRAM array (e.g., bitcell array 130) voltage (VDDA 140) from the logic supply voltage VDDP 120. In other words, VDDA 140 is the voltage supplied to the bitcell array 130 and the VDDP 120 is the voltage supplied to the memory periphery 128 including one or more peripheral devices (e.g., P-devices and/or N-devices). This enables the bit cells in the bit cell array 130 to have a stable voltage supply within a safe voltage range for nominal static noise margin. The peripheral voltage supply VDDP 120 (low voltage level) may be lowered while the bitcell array voltage supply VDDA 140 (high voltage level) remains high for power saving. Level shifters (e.g., level shifters 122 and 136) are typically used to maximize a delta between VDDA 140 and VDDP 120. The lower the minimum VDDP 120, the more power saving in VDDP domain there is. The greater the delta between VDDA 140 and VDDP 120, the greater the performance of circuits in VDDA domain there is. Key characteristics of level shifters (e.g., level shifters 122 and 136) include a maximum operating voltage delta between VDDA 140 and VDDP 120, and a minimum voltage of operation for VDDP 120.

Embodiments disclosed herein solve the problem of a limited operating range in level shifters. The level shifters described herein can be used in SRAM's, other memory IP's, input/output (IO) pads, or any device IPs that require transmission of data from one voltage domain to another without limitation on the operating voltage range. The minimum VDDP can be as low as a threshold voltage (Vt) of the transistor, and VDDA-VDDP delta can be unlimited. VDDA can be as high as the maximum voltage allowed for a given process before transistor damage occurs. In conventional level shifters, the higher the VDDA compared to VDDP, the more difficult it becomes for the n-type transistors (e.g., n-type metal oxide semiconductor (NMOS)) that are controlled by VDDP domain signal to fight against p-type transistors (e.g., p-type metal oxide semiconductor (PMOS)) that are at least partly in the VDDA domain.

Advantages of the present disclosure include, but are not limited to, an unlimited operating range of the level shifter with minimal impact to speed and area. In addition, leakage current is reduced.

Figure 2:
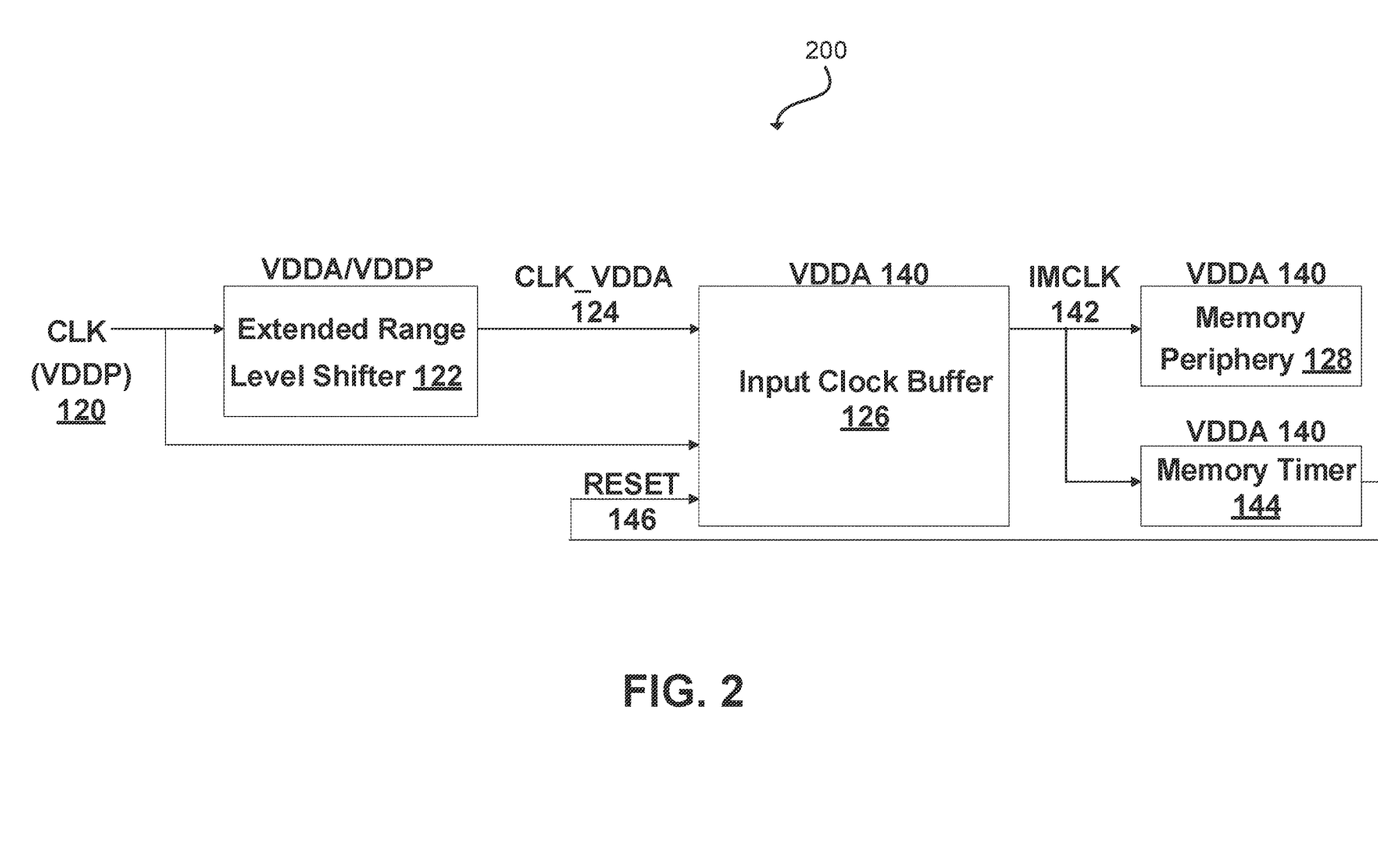
FIG. 2 illustrates a block diagram of a system including an input clock buffer with an extended range level shifter, in accordance with an embodiment of the present disclosure.

FIG. 2 illustrates a block diagram of a system 200 including an input clock buffer 126 and an extended range level shifter 122, in accordance with an embodiment of the present disclosure. Here, the input clock CLK is in the VDDP domain (VDDP 120) and requires level-shifting to the VDDA domain (VDDA 140) to generate CLK_VDDA 124. Some mobility applications require the level-shifter 122 to operate with a very wide range input (e.g., VDDP>VDDA reverse split max: 700 mV, and VDDA>VDDP forward split max: 800 mV). A forward split occurs when VDDA is greater than VDDP and a reverse split occurs when VDDP is greater than VDDA. An input clock buffer 126 receives the level shifted clock CLK_VDDA 124 to generate the internal memory clock IMCLK 142. The input clock level-shifting and buffer, however, require minimum latency in high-speed memory designs.

Existing technology requires the level-shifter 122 to be in series with the input clock buffer 126, resulting in a 20% increase in access time (CLK to Q). As illustrated in FIG. 2, system 200 includes an input clock buffer 126 that takes as input in the parallel combination of CLK 120 and CLK_VDDA 124. In other words, system 200 includes an input clock buffer 126 that is capable of receiving a CLK 120 signal in the VDDP domain and outputs an internal level-shifted clock signal IMCLK 142 in one stage delay. The input clock buffer 126 receives two parallel clock inputs, e.g., CLK: triggers the Internal Memory Clock (IMCLK) whenever the forward split (e.g., difference between VDDA and VDDP) is less than 400 mV, and CLK_VDDA completes the triggering of the IMCLK whenever the forward split (e.g., difference between VDDA and VDDP) is greater than 400 mV.

Advantages of providing the CLK 120 in parallel with CLK_VDDA 124 is that for normal forward split ranges (<400 mV), there is no delay penalty incurred by the serial level-shifter delay, and the dual-rail design produces same access time as a single-rail design. However, as forward split increases (>400 mV) the delayed level shifted clock CLK_VDDA 124 assists in the generation of the IMCLK 142. System 200 may also include a memory timer 144 that takes the internal memory clock (IMCLK 142) as input and provides a reset function 146 that resets the input clock buffer 126. For example, memory timer 144 may initiate a countdown upon receiving the internal memory clock (IMCLK 142) signal and when a predetermined time has expired, the memory timer 144 may generate a reset function 146 signal that resets the input clock buffer 126.

Accordingly, the embodiments disclosed herein provide a memory input clock buffer that also functions as a level shifter capable of supporting a wide range of input clock voltage levels. The embodiments disclosed herein provide a level-shifting function with no latency penalty compared to single-voltage-domain applications without the level-shifting.

Figure 3:
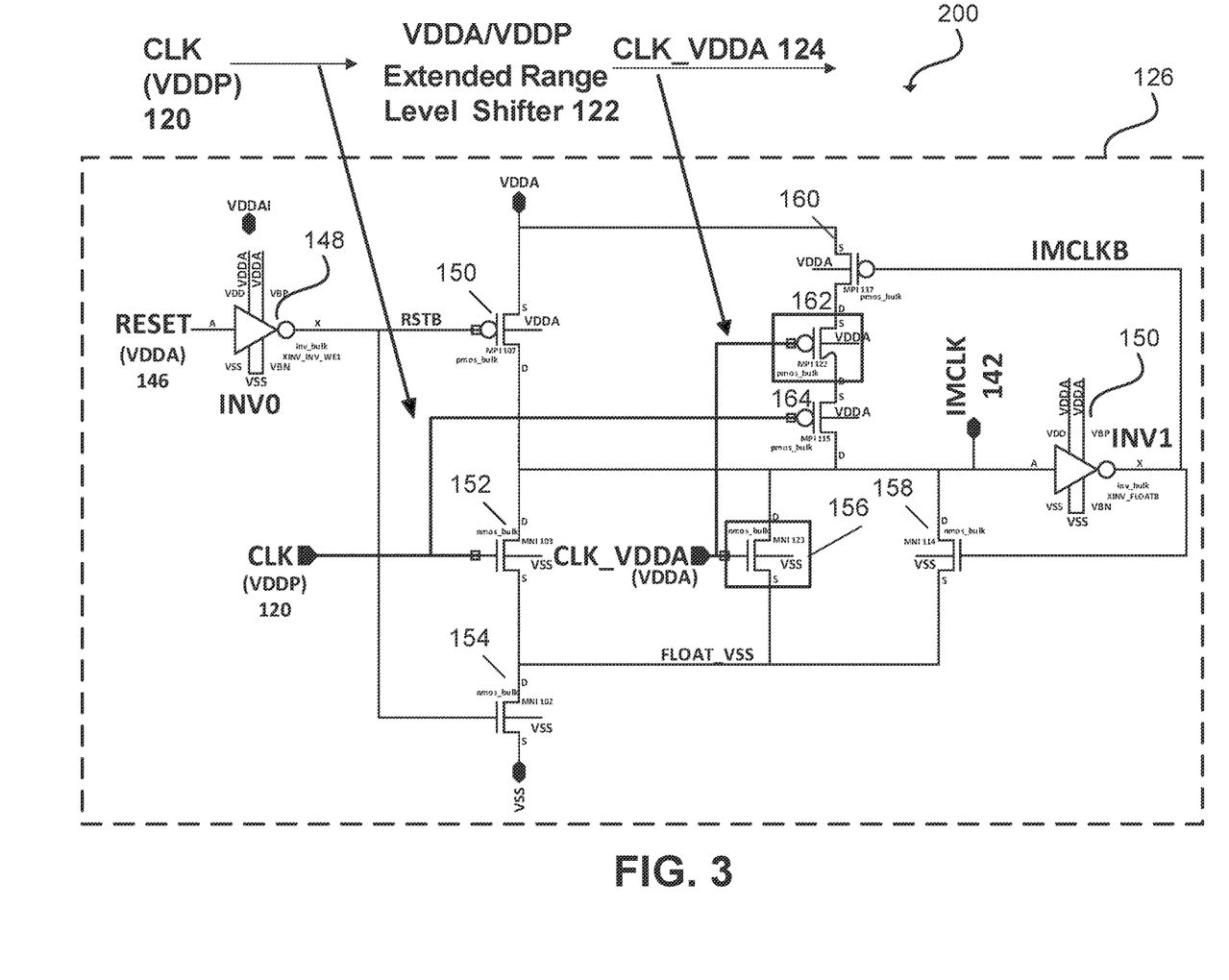
FIG. 3 illustrates a circuit diagram of a system including an input clock buffer with an extended range level shifter, in accordance with an embodiment of the present disclosure.

FIG. 3 illustrates a circuit diagram of a system 200 including an input clock buffer 126 with an extended range level shifter 122, in accordance with an embodiment of the present disclosure. In level shifter 122, when an input signal changes from a low value to a high value, one or more transistors may be on. An n-type transistor may try to pull down a node while a p-type transistor may try to pull up the node.

Input clock buffer 126 includes transistors 150, 152, 154, 156, 158, 160, 162, and 164. Transistors 150, 160, 162, and 164 can be p-type transistors (e.g., p-type metal oxide semiconductor field effect transistors (PMOS)). Transistors 152, 154, 156, and 158 can be n-type transistors (e.g., n-type metal oxide semiconductor field effect transistors (NMOS)). Transistors 150, 152, 154, 156, 158, 160, 162, and 164 may be low voltage transistors (LVT). The P/N ratio is equal to 1/4. When an input signal changes from a low value to a high value, both transistors, n-type and p-type, are on. Input clock buffer 126 may also include inverters 148, 150, which may invert the input signal and provide an output.

Transistor 150 may be coupled between the source and the drain, and transistor 150 may receive a reset voltage RSTB as input from inverter 148. Transistor 152 may be coupled to the drain from transistor 150 receive clock voltage CLK or VDDP 120. Transistor 154 may be coupled between the drain and the source, and transistor 154 may also receive a reset voltage RSTB as input from inverter 148. Transistor 156 may be coupled between the drain and the source, and transistor 156 may receive CLK_VDDA 124 as input from extended range level shifter 122. Transistor 164 may be coupled between the source and the drain and receive clock voltage CLK or VDDP 120 as input. Transistor 162 may be coupled between the source and the drain, and transistor 162 may also receive CLK_VDDA 124 as input from extended range level shifter 122. The output from transistors 162 and 164 is internal level-shifted clock signal IMCLK 142, which is fed to inverter 150, which in turn switches IMCLKB High and feeds that signal to transistor 160 coupled between the source and drain. Transistor 158 may be coupled between the drain and the source, and transistor 158 may also the inverted signal as input from inverter 150.

In some aspects, level shifter 122 may have a maximum VDDA-VDDP range at SFE (slow NMOS, fast PMOS Extreme) −40 C equal to 0.93 V/0.45 V (VDDA/VDDP) with VDDP fixed at 0.45 V. The maximum VDDA-VDDP range at SFE −40 C is equal to 0.85 V/0.43 V (VDDA/VDDP) with VDDA fixed at 0.85 V. The minimum VDDA leakage current is 320 nA for Iddq testing at 0.825 V/0.825 V.

Input clock buffer 126 takes as input, in parallel, the combination of CLK 120 and CLK_VDDA 124, and outputs an internal level-shifted clock signal IMCLK 142 in one stage delay. The input clock buffer 126 receives two parallel clock inputs, e.g., CLK: triggers the Internal Memory Clock (IMCLK) whenever the forward split is <400 mV, and CLK_VDDA: triggers the IMCLK whenever the forward split is >400 mV.

Advantages of providing the CLK 120 in parallel with CLK_VDDA 124 is that for normal forward split ranges (<400 mV), there is no delay penalty incurred by the serial level-shifter delay, and the dual-rail design produces same access time as a single-rail design. However, as forward split increases (>400 mV) the delayed level shifted clock CLK_VDDA 124 assists in the generation of the IMCLK 142.

System 200 may operate in two modes. For example, a normal operating range with a forward split <400 mV, and an extended operating range with a forward split >400 mV. Under the normal operating range, CLK 120 transitions High (CLK_VDDA=Low) and 152 (large) to 164 (small) strength ratio allows IMCLK 142 to transition Low, which in turn switches IMCLKB High to shut off 160 and break the feedback half-latch (160, 162, 164). In the extended operating range, CLK 120 transitions to VDDP, but Low overdrive on 152/154 combination is not strong enough to overcome the High overdrive of the feedback half-latch to completely switch IMCLK 142 to VSS. Therefore, CLK_VDDA 124 switches to VDDA 140 after level shifter delay to completely break feedback half-latch to allow IMCLK 142 to transition to VSS.

Figure 4:
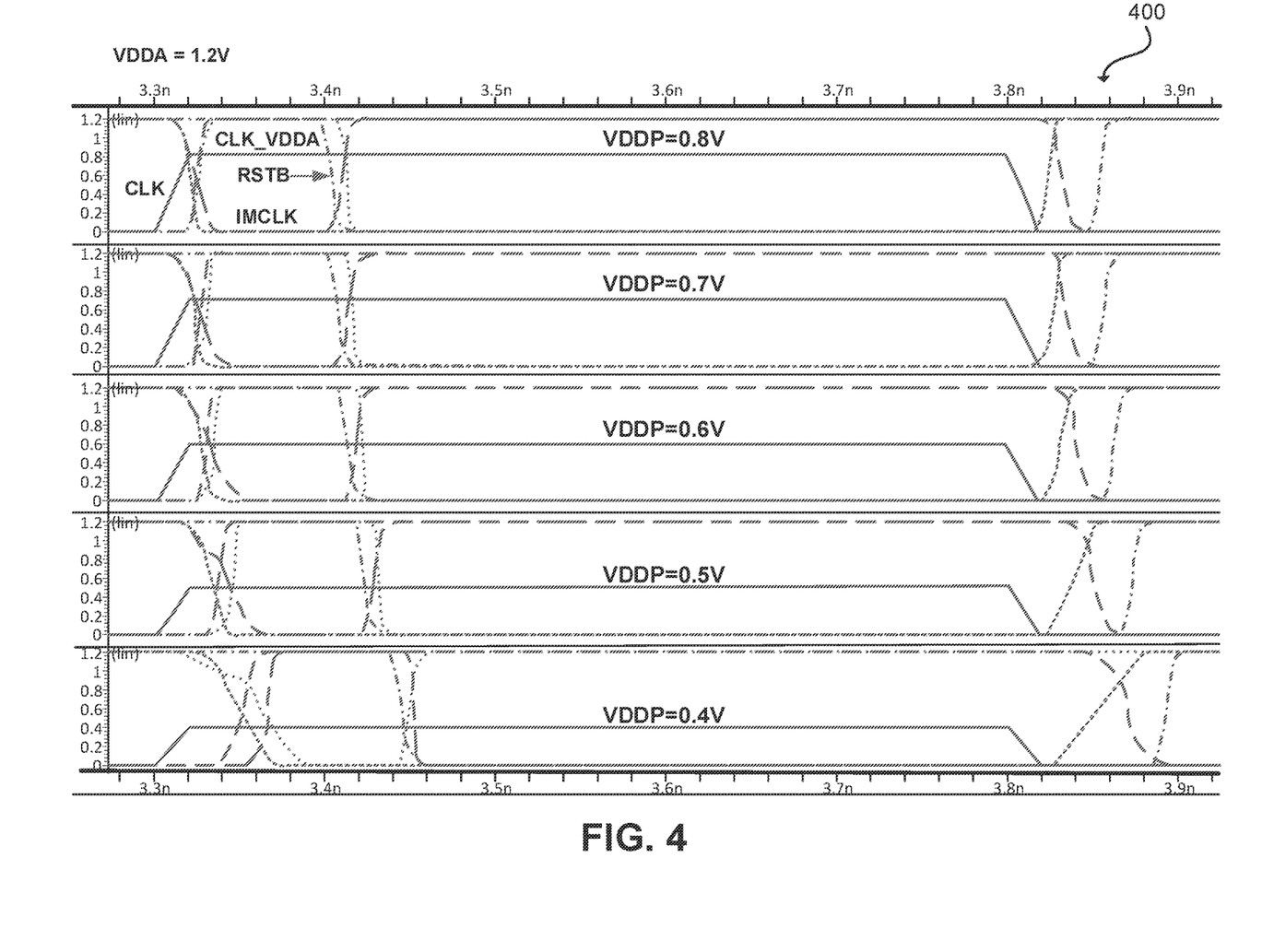
FIG. 4 illustrates waveforms of an example system including an input clock buffer with an extended range level shifter, in accordance with an embodiment of the present disclosure.

FIG. 4 shows the waveform 400 for an input clock buffer 126 with an extended range. More specifically, FIG. 4 shows IMCLK transitions for forward split of 400 mV (VDDP=0.8V, VDDA=1.2V) in increments of 100 mV up to 800 mV (VDDP=0.4V, VDDA=1.2V). It can be observed here that for 400 mV forward split, IMCLK transitions to VSS with only CLK transition. However, for 800 mV forward split, IMCLK is not able to transition to VSS until the arrival of CLK_VDDA.

Figure 5:
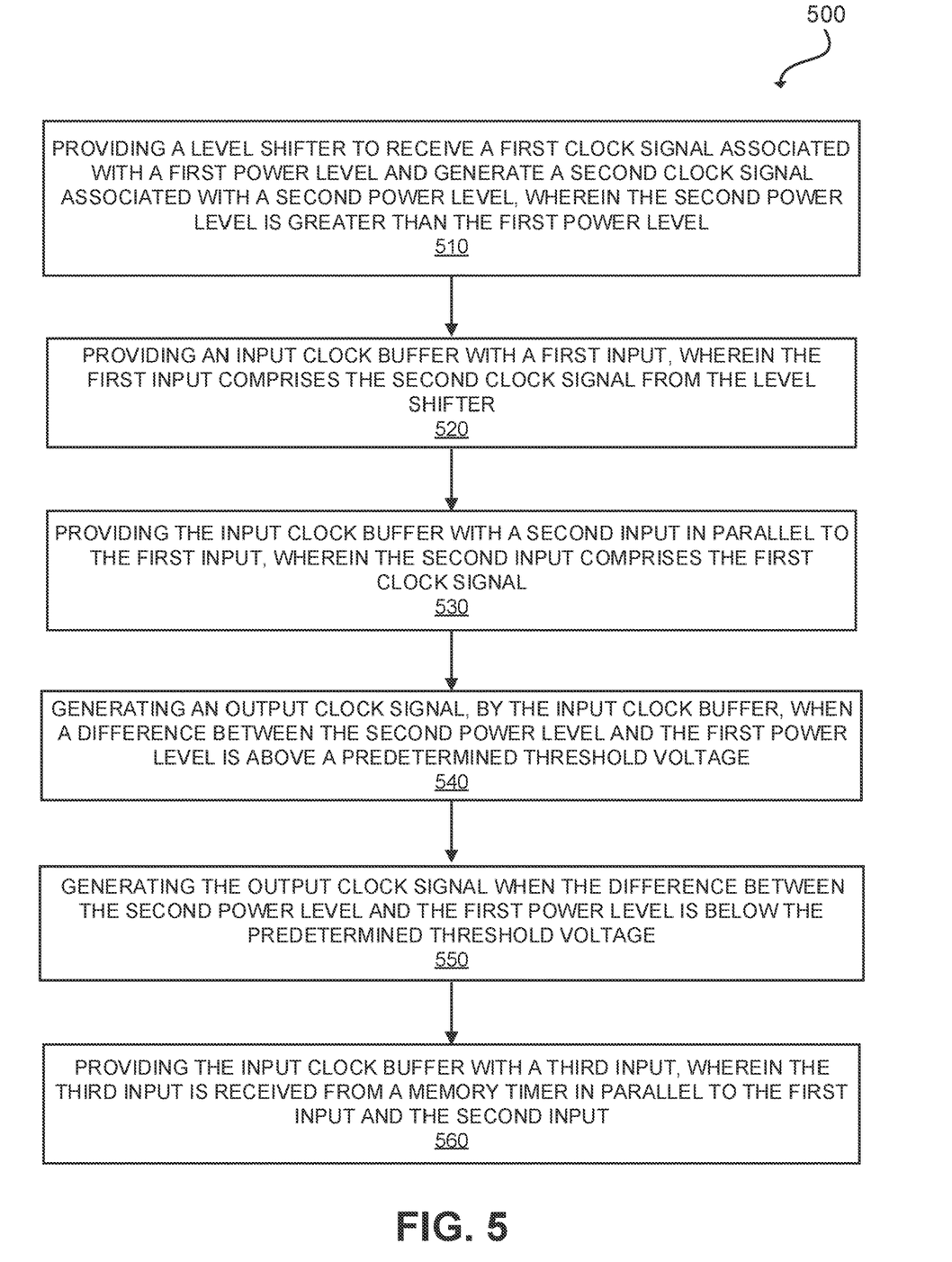
FIG. 5 illustrates example steps in a method for level-shifting in an integrated circuit, in accordance with an embodiment of the present disclosure.

FIG. 5 illustrates example steps in a method 500 for level-shifting in an integrated circuit, in accordance with an embodiment of the present disclosure. At operation 510, the method 500 includes providing a level shifter to receive a first clock signal associated with a first power level and generate a second clock signal associated with a second power level. The second power level may be greater than the first power level. At operation 520, the method further includes providing an input clock buffer with a first input, wherein the first input includes the second clock signal from the level shifter. At operation 530, the method further includes providing the input clock buffer with a second input in parallel to the first input, wherein the second input includes the first clock signal. The first power level may include a peripheral voltage and the second power level may include a bitcell array voltage. At operation 540, the method may further include generating an output clock signal, by the input clock buffer, when a difference between the second power level and the first power level is above a predetermined threshold voltage. At operation 550, the method may include generating the output clock signal when the difference between the second power level and the first power level is below the predetermined threshold voltage.

At operation 560, the method may also include providing the output clock signal as inputs to a memory periphery and a memory timer. The memory periphery and memory timer are coupled in parallel to the input clock buffer. The method may further include providing the input clock buffer with a third input, wherein the third input is received from the memory timer in parallel to the first input and the second input. The output clock signal may include an internal memory clock signal. The method may also include providing a plurality of inverters to introduce a delay in the level shifter circuit. The method may further include coupling an input terminal of the level shifter to an input/output circuit.

Figure 6:
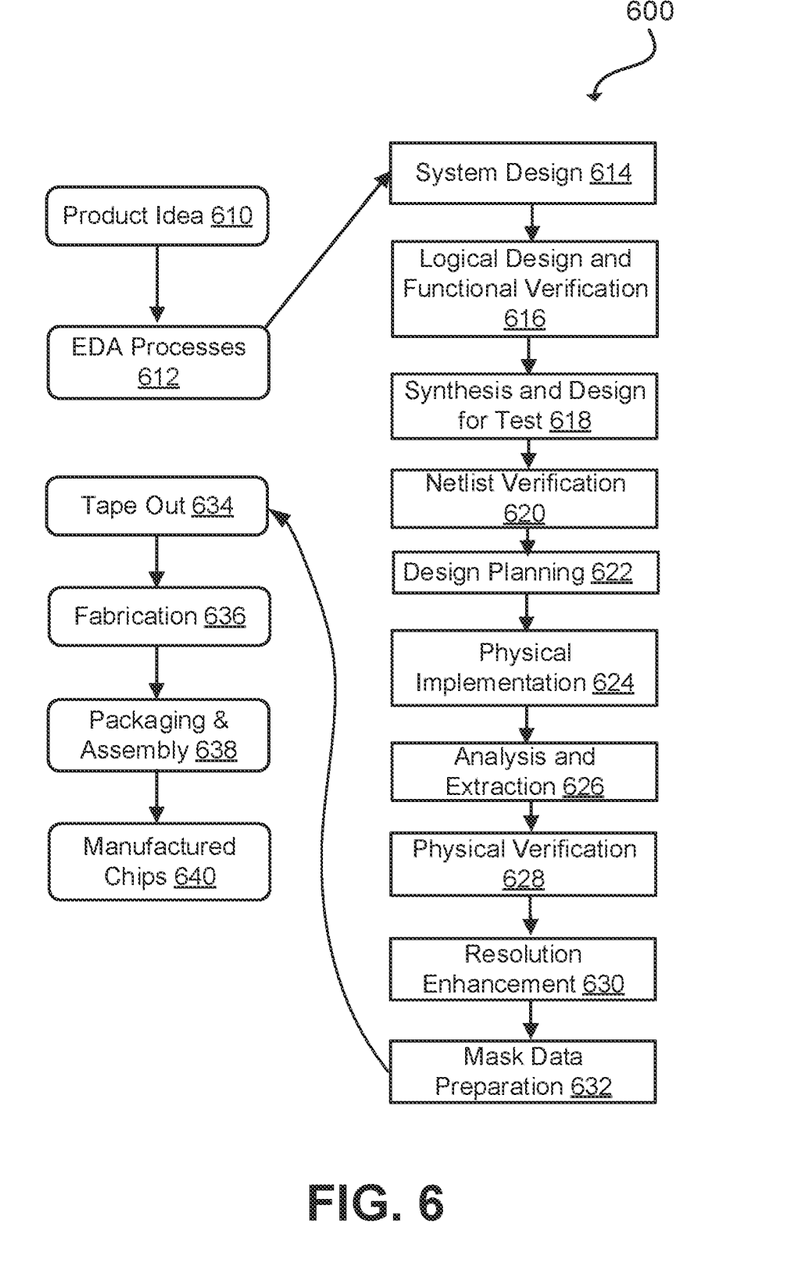
FIG. 6 depicts a flowchart of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes can start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die can be fabricated 636 and packaging and assembly processes 638 can be performed to produce the finished integrated circuit 640.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which can be used for detailed descriptions of circuits with many analog components. Descriptions at each level of abstraction are enabled for use by the corresponding tools of that layer (e.g., a formal verification tool). A design process may use a sequence depicted in FIG. 6. The processes described herein can be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit can be specified in one or more description languages and the specification can be checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' can be used to speed up the functional verification.

During synthesis and design for test 618, HDL code can be transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist can be checked for compliance with timing constraints and for correspondence with the HDL code. During design planning 622, an overall floor plan for the integrated circuit can be constructed and analyzed for timing and top-level routing.

During layout or physical implementation 624, physical placement (positioning of circuit components such as transistors or capacitors) and routing (connection of the circuit components by multiple conductors) can occur, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and can be enabled as both physical structures and in simulations. Parameters can be specified for selected cells (based on 'standard cells') such as size and made accessible in a database for use by EDA products.

During analysis and extraction 626, the circuit function can be verified at the layout level, which permits refinement of the layout design. During physical verification 628, the layout design can be checked to ensure that manufacturing constraints are correct, such as DRC constraints, electrical constraints, lithographic constraints, and that circuitry function matches the HDL design specification. During resolution enhancement 630, the geometry of the layout can be transformed to improve how the circuit design is manufactured.

During tape-out, data can be created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
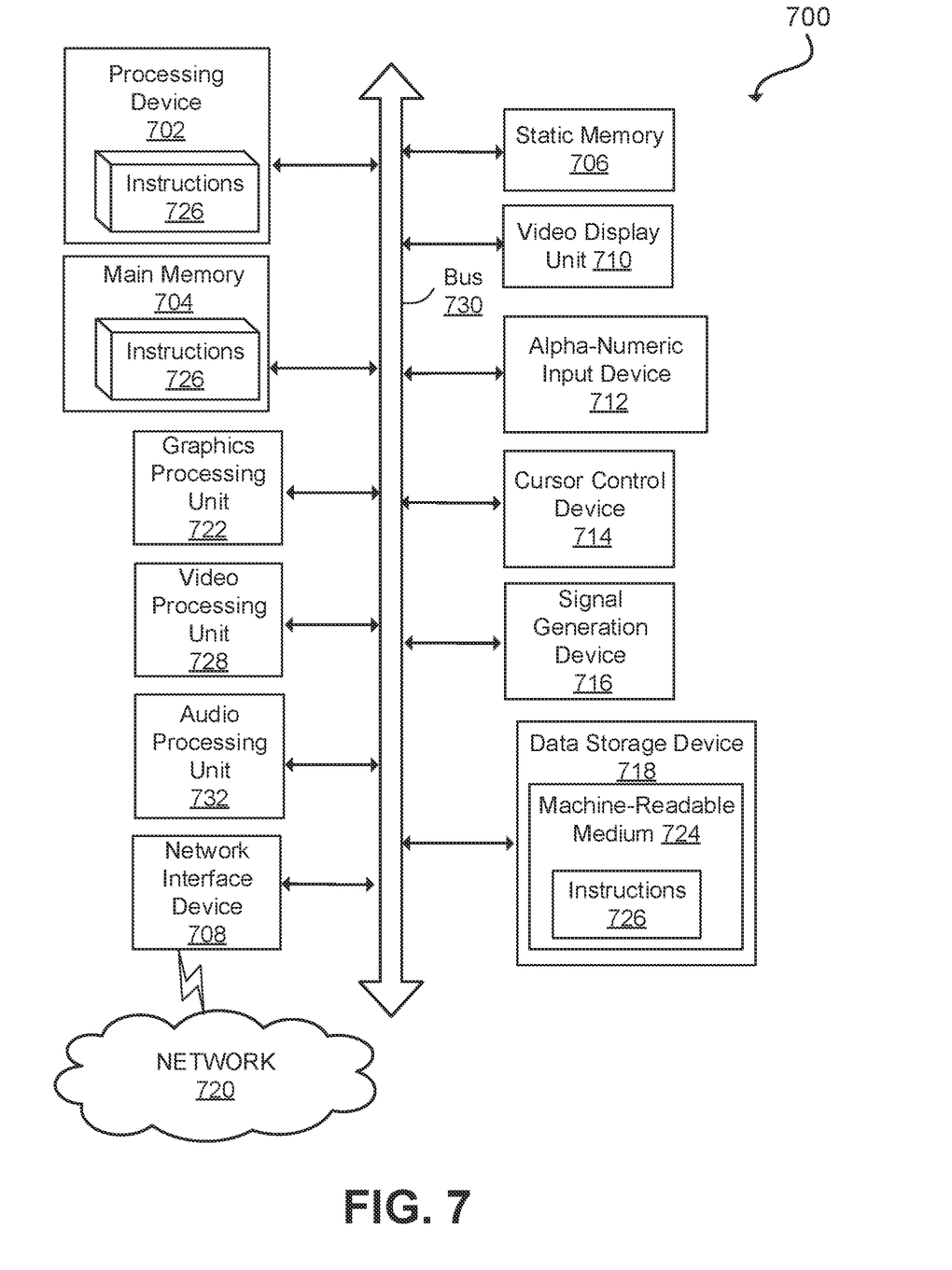
FIG. 7 depicts an abstract diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In one embodiment, the non-transitory computer readable medium may include instructions 726 which when executed by a processing device (e.g., processing device 702), cause the processing device to generate a digital representation of a level-shifting circuit. The level-shifting circuit may include a level shifter configured to receive a first clock signal associated with a first power level (VDDP) and generate a second clock signal associated with a second power level (VDDA). The second power level may be greater than the first power level. The level-shifting circuit may further include an input clock buffer including a first input including the second clock signal from the level shifter, and a second input coupled in parallel to the first input; the second input including the first clock signal. In one embodiment, the first power level includes a peripheral voltage and the second power level includes a bitcell array voltage. The input clock buffer may be configured to generate an output clock signal when a difference between the second power level and the first power level is above a determined threshold voltage, and generate the output clock signal when the difference between the second power level and the first power level is below the determined threshold voltage. The output clock signal may be provided as inputs to a memory periphery and a memory timer, and the memory periphery and memory timer may be coupled in parallel to the input clock buffer.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A level shifter circuit, comprising:
a level shifter configured to receive a first clock signal associated with a first power level (VDDP) and generate a second clock signal associated with a second power level (VDDA), wherein the second power level is greater than the first power level; and
an input clock buffer comprising a first input, wherein the first input comprises the second clock signal from the level shifter, and a second input coupled in parallel to the first input, wherein the second input comprises the first clock signal.

2. The level shifter circuit of claim 1, wherein the first power level comprises a peripheral voltage and the second power level comprises a bitcell array voltage.

3. The level shifter circuit of claim 1, wherein the input clock buffer is configured to generate an output clock signal when a difference between the second power level and the first power level is above a determined threshold voltage, and generate the output clock signal when the difference between the second power level and the first power level is below the determined threshold voltage.

4. The level shifter circuit of claim 3, wherein the output clock signal is provided as inputs to a memory periphery and a memory timer, wherein the memory periphery and memory timer are coupled in parallel to the input clock buffer.

5. The level shifter circuit of claim 4, wherein the input clock buffer comprises a third input, wherein the third input is received from the memory timer in parallel to the first input and the second input.

6. The level shifter circuit of claim 3, wherein the output clock signal comprises an internal memory clock signal.

7. The level shifter circuit of claim 1, wherein the integrated circuit comprises a single rail design or a dual rail design.

8. The level shifter circuit of claim 1, wherein an input terminal of the level shifter is coupled to an input/output circuit.

9. A method for level-shifting in an integrated circuit, the method comprising:
providing a level shifter to receive a first clock signal associated with a first power level and generate a second clock signal associated with a second power level, wherein the second power level is greater than the first power level;
providing an input clock buffer with a first input, wherein the first input comprises the second clock signal from the level shifter; and
providing the input clock buffer with a second input in parallel to the first input, wherein the second input comprises the first clock signal.

10. The method of claim 9, wherein the first power level comprises a peripheral voltage and the second power level comprises a bitcell array voltage.

11. The method of claim 9, further comprising:
generating an output clock signal, by the input clock buffer, when a difference between the second power level and the first power level is above a determined threshold voltage; and
generating the output clock signal when the difference between the second power level and the first power level is below the determined threshold voltage.

12. The method of claim 11, further comprising:
providing the output clock signal as inputs to a memory periphery and a memory timer, wherein the memory periphery and memory timer are coupled in parallel to the input clock buffer.

13. The method of claim 12, further comprising:
providing the input clock buffer with a third input, wherein the third input is received from the memory timer in parallel to the first input and the second input.

14. The method of claim 11, wherein the output clock signal comprises an internal memory clock signal.

15. The method of claim 9, wherein the integrated circuit comprises a single rail design or a dual rail design.

16. The method of claim 9, further comprising:
coupling an input terminal of the level shifter to an input/output circuit.

17. A non-transitory computer readable medium comprising instructions which when executed by a processing device, cause the processing device to generate a digital representation of a level-shifting circuit, the level-shifting circuit comprising:
a level shifter configured to receive a first clock signal associated with a first power level (VDDP) and generate a second clock signal associated with a second power level (VDDA), wherein the second power level is greater than the first power level; and
an input clock buffer comprising a first input, wherein the first input comprises the second clock signal from the level shifter, and a second input coupled in parallel to the first input, wherein the second input comprises the first clock signal.

18. The non-transitory computer readable medium of claim 17, wherein the first power level comprises a peripheral voltage and the second power level comprises a bitcell array voltage.

19. The non-transitory computer readable medium of claim 17, wherein the input clock buffer is configured to generate an output clock signal when a difference between the second power level and the first power level is above a determined threshold voltage, and generate the output clock signal when the difference between the second power level and the first power level is below the determined threshold voltage.

20. The non-transitory computer readable medium of claim 19, wherein the output clock signal is provided as inputs to a memory periphery and a memory timer, wherein the memory periphery and memory timer are coupled in parallel to the input clock buffer.

* * * * *